United States Patent [19]

de Nobel et al.

[11] 3,775,200

[45] Nov. 27, 1973

[54] SCHOTTKY CONTACT DEVICES AND METHOD OF MANUFACTURE

[75] Inventors: Dirk de Nobel; Hendrikus Gerardus Kock, both of Emmasingel, Eindhoven, Netherlands

[73] Assignee: U.S. Philips Corporation, New York, N.Y.

[22] Filed: Aug. 25, 1971

[21] Appl. No.: 174,886

[30] Foreign Application Priority Data

Aug. 29, 1970 Netherlands ...................... 7012831

[52] U.S. Cl. ........... 156/17, 317/234 P, 317/234 M, 317/235, 156/11

[51] Int. Cl. ............................................. H01l 7/50

[58] Field of Search ............................... 156/17, 11; 317/234 P, 234 M, 235

[56] References Cited

UNITED STATES PATENTS 3,110,849 11/1963 Soltys ................................ 317/237

3,214,654 10/1965 Armstong et al. .................. 317/237

3,513,022 5/1970 Casterline et al. ................. 117/212

*Primary Examiner*—Jacob H. Steinberg

*Attorney*—Frank R. Trifari

[57] ABSTRACT

A method is described for making plural semiconductor devices containing a Schottky contact by providing on one side of a semiconductor wafer a metal layer to form the Schottky contact, and then subjecting the opposite side of the wafer to an etching treatment which attacks the semiconductor but not the Schottky metal until semiconductor portions are etched away leaving spaced semiconductor islands whose contact surface with the Schottky method is surrounded by free surface portions of the metal. Then the metal layer is severed along lines spaced from the islands to leave in the final device, an exposed metal surround to increase the breakdown voltage.

6 Claims, 10 Drawing Figures

Figure 1:
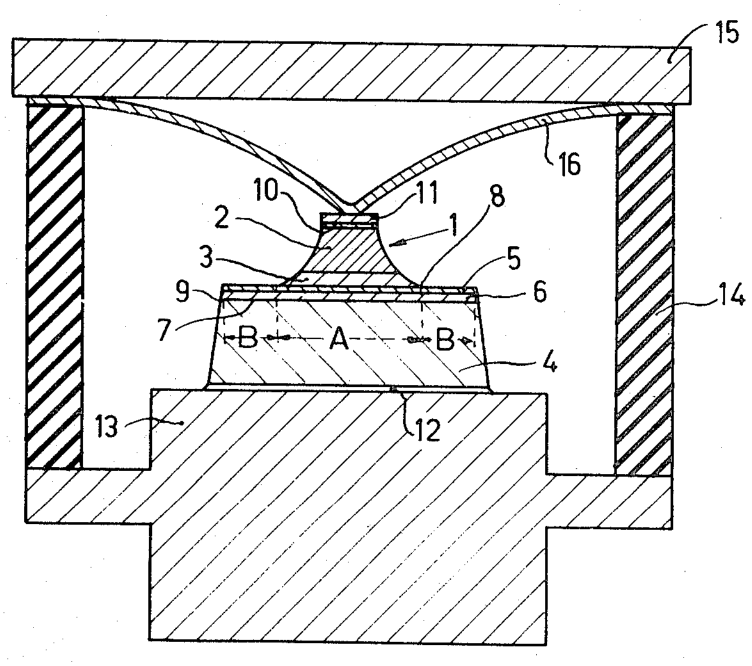

INVENTORS
DIRK DE NOBEL
HENDRIKUS G. KOCK
BY

AGENT

*INVENTORS*
DIRK DE NOBEL
HENDRIKUS G. KOCK
*BY*

AGENT

*INVENTORS*
DIRK DE NOBEL
HENDRIKUS G. KOCK
*BY*
AGENT

SCHOTTKY CONTACT DEVICES AND METHOD OF MANUFACTURE

The invention relates to a semiconductor device comprising a semiconductor body and a metal layer establishing with the semiconductor body a rectifying metal-semiconductor contact (Schottky contact).

The invention furthermore relates to a method of manufacturing such a device.

Semiconductor devices of the kind set forth are known in various embodiments, for example, as a Schottky diode. In known devices of this kind the metal layer establishing the metal-semiconductor contact is restricted to the area of said contact, which usually extends substantially to the edge of the semiconductor body. Apart from Schottky diodes semiconductor devices comprising not only said Schottky contact but also further rectifying or non-rectifying junctions, for example, transistors, thyristors and the like may be constructed in a similar manner.

In these known structures the breakdown voltage of the metal-semiconductor junction is frequently reproducible only with difficulty and is lower than the value to be expected theoretically. This is to be attributed to the fact that also due to the methods of manufacture employed the metal layer is often lacking at the edge of the semiconductor body. This may result in locally very high field strengths at the edge of the metal-semiconductor contact, so that the breakdown voltage of this contact is reduced in a non-reproducible manner. An important cause of these defects resides in potential underetching of the metal layer during manufacture as a result of which parts of the metal layer located at the semiconductor edge are etched off. When the device is arranged on a support by the metal-semiconductor contact, this may give rise to mechanical problems, which may, under given conditions, prevent the establishment of a satisfactory thermal and electrical contact between the support and the metal layer.

The invention has inter alia for its object to provide a novel structure of such a semiconductor device, in which the said disadvantages involved in known devices are avoided or at least considerably mitigated.

The invention has furthermore for its object to provide a novel, very simple and efficacious method of manufacturing such a device.

The invention is based inter alia on the recognition that a marked improvement in the electrical, thermal and mechanical properties of the device can be obtained by applying the metal layer intended to form the rectifying metal-semiconductor contact so that this layer extends not only on the metal-semiconductor contact but also beyond said contact and also beyond the semiconductor body.

A semiconductor device of the kind set forth, embodying the invention, is characterized in that the metal layer comprises a first portion which establishes, over its entire area, said metal-semiconductor contact and a second portion which extends beyond the semiconductor body and joins this contact throughout the length of the edge of the metal-semiconductor contact.

In this Application said metal layer is to denote not only a homogeneous single-metal layer but also a composite layer comprising a plurality of layers of different metals, one side of which establishes a metal-semiconductor contact with the semiconductor body.

In the device according to the invention the edge of the metal layer does not coincide with the edge of the metal-semiconductor contact and is neither located in the immediate proximity of the edge of the semiconductor body. Therefore, the edge of the metal-semiconductor contact does not exhibit irregularities likely to adversely affect the breakdown voltage of said contact. When the semiconductor body is arranged on a support by the metal-semiconductor contact, the establishment of a satisfactory electrical and thermal contact between the metal-semiconductor contact and the support is then facilitated, whereas a direct contact between the semiconductor material and the support cannot occur. Moreover, particularly with devices for use at very high frequencies, which comprise a comparatively very small semiconductor body, it is an important advantage that the metal layer portion extending beyond the body is conducive to handling, particu-larly to the final mounting of the device, whilst, if desired, a connecting conductor can be provided on said portion of the metal layer.

The semiconductor body may have different shapes, but in general it will have the shape of a wafer. In many cases it will be preferred, in order to fully utilize said advantages, to choose a projecting second metal layer portion which is not too small. In this respect a preferred embodiment of the invention, in which the semiconductor body is wafer-shaped, is characterized in that the second metal layer portion projects beyond the metal-semiconductor contact everywhere over a distance which is at least equal to the thickness of the semiconductor body.

In order to obtain the highest possible breakdown voltage, the field strengths appearing particularly at the edge of the metal-semiconductor contact have to be as low as possible. Hence a further important, preferred embodiment is characterized in that the cross section of the semiconductor body decreases, viewed from the metal-semiconductor contact, over at least part of the thickness of the body. This provides a MESA structure having such a bevelled edge that the field strength at the edge of the Schottky junction is considerably reduced.

Although the invention provides important advantages for a large number of different semiconductor devices inter alia for example, apart from diodes, transistors and thyristors for high or lower powers, it is particularly significant in the case in which the device forms an avalanche diode for generating and/or amplifying high-frequency, electro-magnetic oscillations. Such avalanche diodes have a comparatively high dissipation and very small dimensions so that they can be manipulated only with difficulty in their conventional form, particularly in the mounting operation, whilst an effective cooling often gives rise to problems. By using the structure embodying the invention these problems are avoided or at least reduced.

In connection with the resultant, very satisfactory electrical properties at least the semiconductor body region being in contact with the metal layer preferably consists of silicon (or gallium arsenide), while at least the metal layer region being in contact with said region consists of palladium (or titanium respectively).

The semiconductor body and the metal layer applied thereto and establishing the rectifying metal-semiconductor contact may, if desired, be constructed as a self-supporting unit, in which case, if desired, the metal layer may be chosen to be sufficiently thick to serve at the same time as a connecting conductor in analogy with the known beam-lead structure. In many cases, however, it will be advantageous, inter alia to improve the mechanical rigidity, to construct the device so that at least the first portion of the metal layer (which establishes the rectifying metal-semiconductor contact) is located on a supporting body having a larger, usually ten times larger thickness than the metal layer. In this case both the first portion of the metal layer and the second portion (projecting beyond the semiconductor body) are preferably located on the supporting body, while the metal layer extends everywhere to at least the edge of the supporting body. Since cooling is most effective in the direct proximity of the metal semiconductor contact, where the heat is produced, the supporting body consists advantageously of a material of high thermal conductivity and preferably contains one or more metals of the group of copper, silver and aluminum, although insulators of satisfactory thermal conductivity, for example, beryllium oxide, may be utilized.

The present invention is furthermore based on the recognition that the device described can be obtained by a very simple and efficacious method in which, in contrast to the conventional methods, no risk of underetching of the metal layer is involved. Hence a method of manufacturing a semiconductor device of the kind set forth embodying the invention is characterized in that to one side of a semiconductor layer is applied a metal layer which establishes a rectifying metal-semiconductor contact with the semiconductor layer, in that by etching grooves from the other side of the semiconductor layer with the aid of an etchant substantially not attacking said metal layer, the semiconductor layer is divided into island-shaped regions and in that the connection between these island-shaped regions beyond the semiconductor material is interrupted so that portions of the metal layer are maintained, which completely surround the contact surface between each island-shaped region and the metal layer.

In a very important, preferred embodiment, subsequent to the application of the metal layer and prior to etching of the grooves, the metal layer is provided with a layer of a supporting material, preferably by deposition of a metal containing one or more of the metals of the group of copper, silver and aluminum. This may be carried out by vapour deposition or by chemical agency, but preferably by electrolytic deposition. In this way not only underetching of the Schottky metal layer is avoided, but also a very satis-factory thermally and electrically conductive contact is established between the metal layer and the supporting body.

The invention furthermore relates to a device manufactured by said method.

Figure 2:
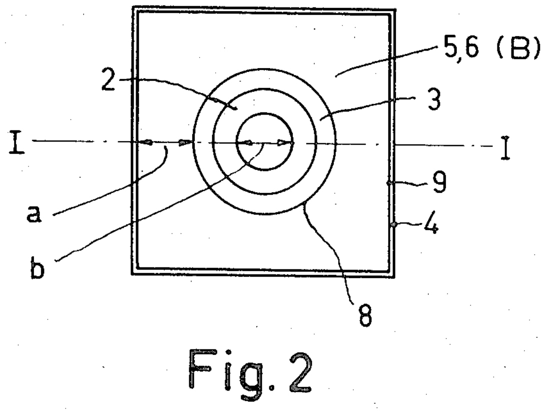
Figure 3:
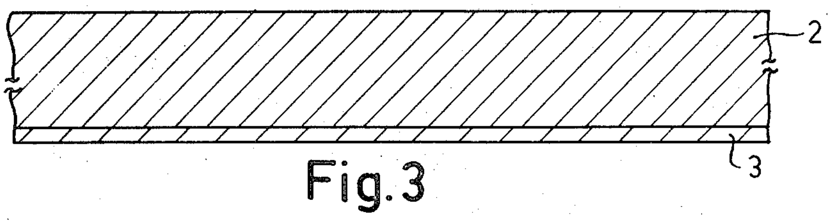
Figure 4:
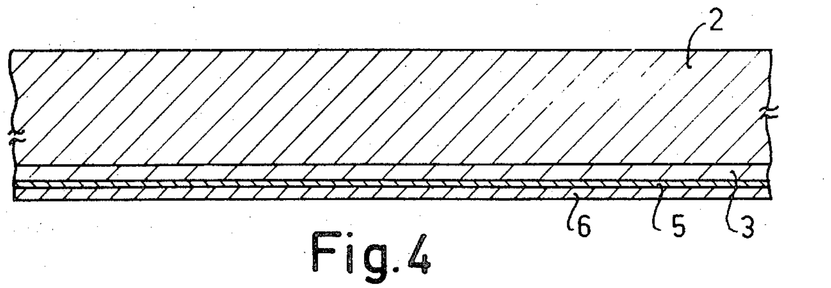
Figure 5:
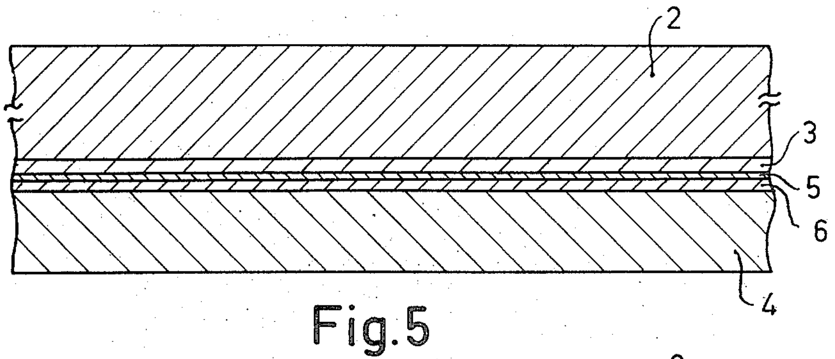
Figure 6:
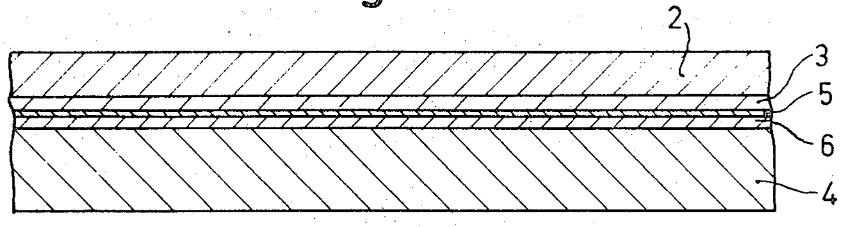
Figure 7:
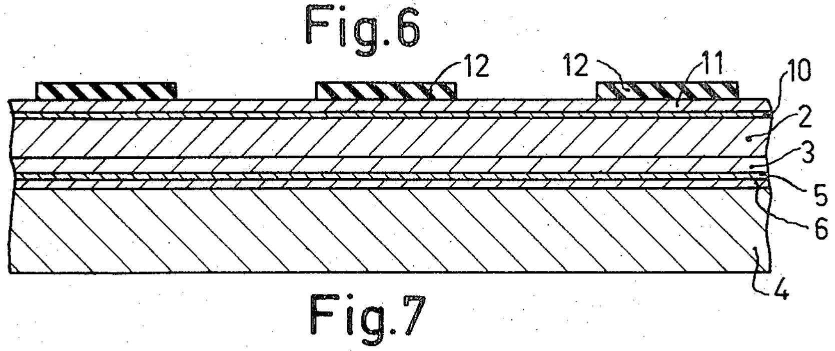
Figure 8:
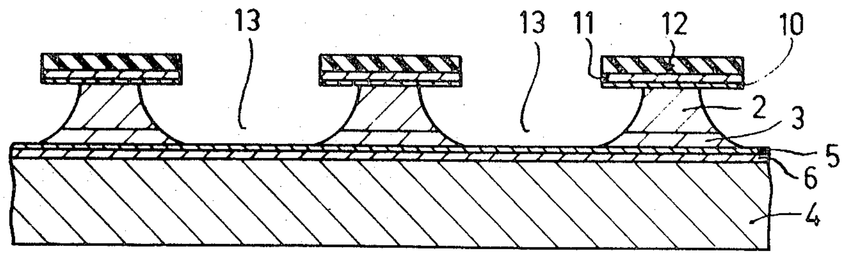
Figure 9:
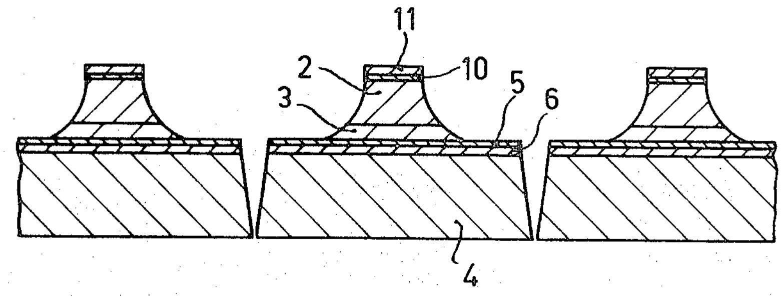
Figure 10:
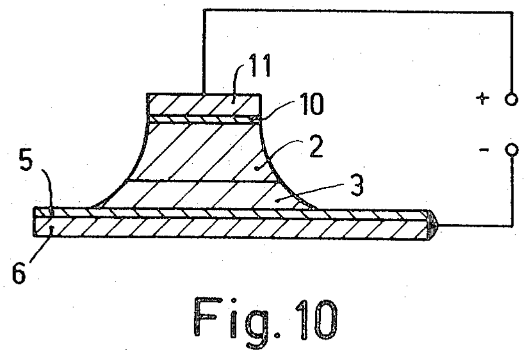

The invention will now be described more fully with reference to an embodiment and the drawing, in which FIG. 1 is a schematic sectional view of a device embodying the invention, FIG. 2 is a plan view of a detail of the device shown in FIG. 1, FIGS. 3 to 9 illustrate the device shown in FIGS. 1 and 2 in successive phases of manufacture and FIG. 10 is a schematic cross-sectional view of a device without support embodying the invention.

The Figures are schematic and not to scale, which particularly applies to the dimensions in the direction of thickness.

In the drawing corresponding parts are, as a rule, designated by the same reference numerals.

FIG. 1 is a schematic cross sectional view of a semiconductor device embodying the invention and FIG. 2 is a plan view of part of the device shown in FIG. 1 in the sectional view taken on the line I—I. In this case the device is an avalanche diode for producing or amplifying electro-magnetic oscillations at a frequency of about $10^{10}$ Hz (10 GHz). The diode comprises a semiconductor body 1 of silicon, having a low-ohmic n-type substrate region 2 of a resistivity of about 0.008 Ohm.cm, on which an epitaxial n-type layer 3 of a thickness of 7 $\mu$m and of a resistivity of 0.8 Ohm. cm. is grown. The device comprises furthermore a metal layer 5,6, formed by a layer of palladium 5 having a thickness of 0.1 $\mu$m and a gold layer 6 having a thickness of 0.5 $\mu$m. The layer (5,6) establishes by the palladium side 5 a rectifying metal-semiconductor contact (Schottky contact) with the epitaxial layer 3 of the silicon body 1, while the layer (5,6), by the gold side 6, is in contact throughout its surface with the surface 7 of a supporting body 4, formed by a 100 $\mu$m thick copper layer. The metal-semiconductor contact is bounded by the circular edge 8 (see also FIG.2).

According to the invention the metal layer (5,6) comprises a first portion A (see FIG. 1), which is bounded by the edge 8 and forms over its entire area the metal-semiconductor contact, and a second portion or surround B which projects beyond the semiconductor body 1. The portion B is bounded by the edge 8 of the Schottky contact and by the edge 9 of the support 4, the Schottky contact being throughout the length of its edge 8 adjacent the second portion B. This is obvious from FIG. 2, which is a schematic plan view of the supporting body 4 and the silicon body 1 with the sandwiched metal layer (5,6). The substrate region 2 (see FIG. 1) is provided with a 0.1 $\mu$m thick palladium layer 10 and a 0.5 $\mu$m thick gold layer 11. These metal layers form a practically ohmic contact on the highly doped substrate region 2.

The diameter of the circle 8 is 120 $\mu$m, the thick-ness of the wafer-shaped semiconductor body is 50 $\mu$m and the minimum distance *a* between the circle 8 and the edge 9 (see FIG. 2) is 190 $\mu$m so that the metal layer (5,6) projects everywhere beyond the metal-semiconductor contact over a distance amounting to more than three times the thickness of the semiconductor body. The diameter *b* (FIG. 2) is 80 $\mu$m.

From FIG. 1 it will be apparent that the edge of the silicon wafer is bevelled so that reckoned from the metal-semiconductor contact the diameter of the wafer decreases. In this way an optimum field distribution in the silicon is obtained at the edge of said contact, when a negative potential relative to the ohmic contact (10,11) is applied to the metal layer (5,6). Thus a comparatively high breakdown voltage (about 70 V) of the diode is obtained.

The diode is then assembled in a conventional manner: by means of a very thin and hence satisfactorily conductive soldering layer 12 (thickness about 5 $\mu$m) the support 4 is fastened to the bottom 13 of an envelope, which bottom is separated by an insulating wall 14 of ceramic material from a metal sheet 15, which is in contact with a gold wire 16, which is secured by thermo-bonding to the metal layer (10, 11)

Throughout the surface of the circle 8 the metal layer (5, 6) establishes a homogeneous contact with the epitaxial layer 3 without discontinuities on or near the edge 8 in the metal layer. Thus as compared with known structures the reproducibility and the electrical and thermal properties of the diode are materially improved. Moreover, despite the small dimensions of the semiconductor body the diode can be readily handled during the mounting operation owing to the comparatively large dimensions (500 × 500 $\mu$m) of the combination of the metal layer (5, 6) plus the support 4.

The semiconductor device described above may be manufactured in a simple way as follows (see FIGS. 3 to 9).

The manufacture starts from a silicon sheet, from which a large number of identical diodes are to be made. The silicon sheet comprises an n-type substrate region 2 with (111)-orientation, a resistivity of 0.008 Ohm.cm and a thickness of 200 $\mu$m, on which an epitaxial n-type layer 3 of a resistivity of 0.8 Ohm.cm and a thickness of 7 $\mu$m is grown (see FIG. 3). By conventional techniques the layer 3 is subsequently provided with a 0.1 $\mu$m thick palladium layer 5 and a 0.5 $\mu$m thick gold layer 6 (see FIG. 4). With the silicon layer 3 this composite layer (5, 6) establishes a rectifying metal-semiconductor contact.

Subsequently, on the side of the gold layer 6 a 100 $\mu$m thick copper layer 4, serving as a support, is electrolytically deposited from a copper sulphate bath on the composite metal layer (5,6). The result is the structure shown in FIG. 5.

Then the substrate region 2 is partly etched by an etchant of the composition: 1,250 cc of $HNO_3$ (50 percent by weight), 250 cc of $HNO_3$ (fumigant) (96 percent by weight), 500 cc of acetic acid (98 percent by weight) and 200 cc of HF (50 percent by weight). Etching is performed at a temperature laying between 0° and 2° C and is continued until the overall thickness of the silicon is 50 $\mu$m (see FIG. 6).

Then a 0.1 $\mu$m thick palladium layer 10 and a 0.5 $\mu$m thick gold layer 11 are deposited from the vapour phase on the substrate region 2, after which a photoresist mask 12 is applied to the gold layer 11 (see FIG. 7) with the aid of materials and masking methods generally employed in semiconductor technology. Subsequently, the exposed portions of the palladium-gold layer (10, 11) are etched away by means of a solution of 100 g of KI, 50 g of $I_2$ and 1,000 g of water at rom room after which the subjacent silicon (2, 3) is etched away by means of a solution containing 1 part by volume of HF (50 percent by weight) and 10 parts by volume of $HNO_3$ (65 percent by weight). The (circular) portions of the palladium-gold layer (10, 11) not etched away are used as an etching mask. During this etching treatment, in which the etchant employed does not attack the palladium-gold layer (5, 6), grooves 13 (see FIG. 8) are formed, which divide the silicon (2, 3) into island-shaped regions, the diameter of which reckoned from the layer (5, 6) decreases in upward direction, due to underetching which removes a slight quantity of silicon also beneath the edge of the masking layer portions (10, 11). This results in the structure shown in FIG. 8.

Beyond the silicon mesa said island-shaped silicon regions are connected with each other by the metal layer (5, 6) and the supporting material, in this case the copper layer 4. These connections are interrupted by cutting with the aid of a razor blade so that separate diodes are obtained. Thus portions of the metal layer (5, 6) are left, which completely surround the contact surface between each island-shaped region (2, 3) and this metal layer. The protruding portions of the layers (10, 11) are removed by compressed air, after which the structure shown in FIG. 9 is obtained. The diodes can then be housed in an appropriate envelope as is illustrated in FIG. 1.

The application of the supporting layer 4 prior to etching of the grooves is a safeguard for the establishment of a very satisfactory electrical and thermal contact of the support 4 with the metal layer (5, 6), in contrast to conventional methods in which the silicon islands, each provided with the Schottky contact, are first manufactured separately and subsequently fastened to a support so that, for example, dust particles in conjunction or not in conjunction with a poor soldering joint may get in between the Schottky metal layer and the support.

It will be obvious that the invention is not restricted to the embodiment shown by way of example and that within the scope of the invention many variants are possible to those skilled in the art. For example, the metal layer (5, 6) may be a single layer of homogeneous composition, for example, a palladium layer, a nickel layer or a layer of another suitable metal which is capable of forming a Schottky contact with the semiconductor body. Moreover, the semiconductor material may be another material than silicon, for example, gallium arsenide; in the latter case the portion of the metal layer (5, 6) which establishes the contact with the gallium arsenide preferably consists of titanium. Instead of being formed by regions of different dopings the semiconductor body may be homogeneous and be used in the form of a thin layer of a few microns.

Advantageously the supporting body may consists not only of copper but also of silver or aluminum or alloys thereof, as well as of other thermally satisfactorily conductive metals or non-metals, such as beryllium oxide, in the latter case it is advantageous to fasten a connecting conductor to the portion B of the layer (5, 6).

The separate devices manufactured on a single semiconductor sheet may be severed, as is described with reference to FIGS. 8 and 9, by cutting, but also by other methods, both mechanical operations such as scratching, breaking, sawing and chemical operations such as etching; in the latter case, however, an additional mask is required. The semiconductor device may furthermore be, apart from a diode, a transistor, for example, a transistor comprising a Schottky collector, a thyristor or a different device comprising a rectifying metal-semiconductor contact. The semiconductor body need not have a bevelled edge in the sense of the Figures, as in the embodiment described, throughout its entire thickness, under given conditions the bevelled part may be restricted to a body portion adjacent the Schottky contact or, if desired, it may be completely omitted.

It should finally be noted that under given conditions the device embodying the invention may be manufactured and used without a support (see, for example, the cross section of FIG. 10). Then the Schottky layer (5, 6) may have such a thickness that it can at the same time be used as a connecting conductor in analogy with the known "beam-lead" structure.

What is claimed is:

1. A method of making a plurality of semiconductor Schottky contact devices in a common wafer, comprising providing a wafer-like body of semiconductor material having opposed major surfaces, providing on the entire side of one of the major surfaces a continuous first metal layer which forms with the semiconductor a metal-semiconductor rectifying Schottky contact, masking a plurality of spaced portions of the opposite major surface, subjecting unmasked portions of the semiconductor body to an etchant which dissolves the semiconductor material but not the first metal layer so that grooves are etched in the body beginning from the opposite major surface an extending entirely through the body to the first metal layer and until the semiconductor body is divided into a plurality of spaced mesa-like islands all connected to a common first metal layer with each island having first metal layer portions free of the semiconductor and completely surrounding the actual contact surface between each island and the first metal layer, and thereafter severing the first metal layer laong lines spaced from the islands which maintain in the final device a free first metal layer portion completely surrounding the aforementioned contact surface.

2. A method as claimed in claim 1 wherein prior to the etching step and subsequent to provision of the first metal layer, a second supporting conductive layer is deposited on top of the first metal layer to fully cover same and to a thickness exceeding that of the first metal layer.

3. A method as claimed in claim 2 wherein the second layer is electrolytically deposited.

4. A method as claimed in claim 3 wherein the second layer is at least one of copper, silver, and aluminum.

5. A method as claimed in claim 1 wherein the etching step is continued until the free metal layer portion has a lateral dimension at least equal to the thickness of the semiconductor.

6. A method as claimed in claim 5 wherein the semiconductor is of silicon or gallium arsenide, and the first metal is palladium when the semiconductor is silicon and titanium when the semiconductor is gallium arsenide.

* * * * *